(12) United States Patent
Kiyomura et al.

(10) Patent No.: US 7,786,539 B2
(45) Date of Patent: Aug. 31, 2010

(54) DIELETRIC FILM LAYERED PRODUCT

(75) Inventors: Takakazu Kiyomura, Tokyo (JP); Takuo Ohashi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 32 days.

(21) Appl. No.: 11/972,729

(22) Filed: Jan. 11, 2008

(65) Prior Publication Data
US 2008/0169520 A1    Jul. 17, 2008

(30) Foreign Application Priority Data
Jan. 15, 2007   (JP)   ............................ 2007-005923
Nov. 13, 2007   (JP)   ............................ 2007-294306

(51) Int. Cl.
*H01L 29/78*    (2006.01)
(52) U.S. Cl. ....................... 257/411; 257/410
(58) Field of Classification Search ................. 257/411, 257/410
See application file for complete search history.

(56) References Cited
U.S. PATENT DOCUMENTS

2006/0054980 A1*   3/2006   Kim et al. ................... 257/410
2008/0070395 A1*   3/2008   Yen et al. .................... 438/591
2008/0164582 A1*   7/2008   Govindarajan .............. 257/635

FOREIGN PATENT DOCUMENTS

JP    2005-64032      3/2005

\* cited by examiner

*Primary Examiner*—Wai-Sing Louie
*Assistant Examiner*—Bilkis Jahan
(74) *Attorney, Agent, or Firm*—Young & Thompson (57) ABSTRACT

In order to provide a dielectric film which can avoid both boron leakage and an increase of the leak current, a semiconductor apparatus which has the dielectric film, a production method of the dielectric film and a production method of the semiconductor apparatus, a dielectric film layered product is applied which includes: a semiconductor substrate (2); a first hafnium-containing silicon oxide nitride layer (3a) made from a microcrystalline structure; a second hafnium-containing silicon oxide nitride layer (3b) made from a non-crystalline structure; and a layered film which is made from the first and second hafnium-containing silicon oxide nitride layers that are layered on the semiconductor substrate, and which has a nitrogen ratio of 15-40 atomic percent.

8 Claims, 8 Drawing Sheets

DIELETRIC FILM LAYERED PRODUCT

BACKGROUND OF THE INVENTION

1. Field of the Invention

The present invention relates to a dielectric film layered product, a production method of the dielectric film layered product, a semiconductor apparatus and a production method of the semiconductor apparatus. In particular, the present invention relates to a dielectric film layered product and a production method of the dielectric film layered product for achieving a low leak current and a good boron leakage tolerance.

Priority is claimed on Japanese Patent Applications No. 2007-005923, filed Jan. 15, 2007, and No. 2007-294306, filed Nov. 13, 2007, the contents of which are incorporated herein by reference.

2. Description of Related Art

In recent years, semiconductor apparatuses have had larger capacities than before and have been gradually becoming even larger. In this sense, semiconductor devices have been more and more refined. Along with the progress in refining the semiconductor devices, the pattern size has been becoming smaller in a plane due to lithography technology, and moreover the thickness of a film has been becoming smaller. For example, there is demand for a gate insulator of a transistor which has a thickness of 3 nm or less. However, there are various problems with regard to film which has a thickness of 3 nm or less by using a silicon oxidation film used in conventional techniques as a gate insulator.

For example, if the gate insulator is thin, there is a problem in which a gate leak current increases because of direct tunneling phenomena. Moreover, there is a possibility in which a dopant impurity (for example, boron) included in a gate terminal is diffused inside the gate insulator by heat and enters into a silicon substrate under the gate insulator. Such phenomena is called a boron leakage. Therefore, there is a strong need for the gate insulator to have a less leak current and an excellent boron leakage tolerance.

Materials of gate insulator other than silicon oxide are generally well-known such as HfSiON, HfAlON, HfZrSiON and HfZrAlON which are made by using Hf oxide as mother material.

These materials are made in a MOCVD method and the like, and these materials are preferably in a non-crystal state. The reason why these materials are preferably in a non-crystal state is that a grain boundary is necessarily included if a polycrystal is made from a film of such materials. Such a gain boundary causes an increased leak current.

A conventional technique as shown in the following Patent Document 1 is generally known for forming a silicon oxide film including Hf as a non-crystal/amorphous film. In Patent Document 1 shown below, a generation method of a gate insulator is disclosed in which the grain boundary is not generated even after a heating operation at 1000° C. or lower. In accordance with Patent Document 1, in order to obtain a gate insulator, a metal silicate film which is obtained at a metallic ratio of 62% or less and a nitrogen ratio of 30% or higher is formed on a substrate boundary layer made from $SiO_2$, and moreover, on the metal silicate film, another film of silicic acid metal including 50-80% of nitrogen is formed. In other words, it is possible to produce the gate insulator without forming a grain boundary by forming a concentration distribution of nitrogen.

In accordance with the dielectric film of Patent Document 1, nitrogen is included in the film. Therefore, it is considered that the dielectric film has a good boron tolerance. However, in a case in which a certain EOT (Equivalent Oxide Thickness) is required or given, compared to a crystalline film, a non-crystalline film has a lower permittivity, and a smaller physical film thickness. Therefore, there is a problem in a conventional technique described in Patent Document 1, that is, it is difficult to control a gate leak current caused by direct tunneling phenomena.

[Patent Document 1] Japanese Patent Application, First Publication No. 2005-64032

SUMMARY OF THE INVENTION

As describe above, nowadays, there is no solution for solving both the problem of controlling boron leakage and the problem of controlling an increase of the leak current.

The present invention was conceived in order to solve the above-described problems and to provide a dielectric film which can avoid both boron leakage and an increase of the leak current, a semiconductor apparatus which has the dielectric film, a production method of the dielectric film, and a production method of the semiconductor apparatus.

In order to solve the above-described problems, as a result of studies by inventors of the present invention, researchers, and the like, it is proposed that the following characteristics are necessary for realizing an ideal gate insulator which has both a good tolerance with regard to boron leakage and a low gate leak current. That is, the gate current insulator can avoid both an increase of the leak current caused by forming a grain boundary and an increase of the gate leak current caused by the direct tunneling phenomena because of producing a thinner film, and moreover, avoids boron leakage by including nitrogen in a dielectric layer. Therefore, the present invention has, for example, the following constitutions in order to solve the above-described problems.

One aspect of the present invention is, for example, a dielectric film layered product including: a semiconductor substrate; a first hafnium-containing silicon oxide nitride layer made from a microcrystalline structure; a second hafnium-containing silicon oxide nitride layer made from a non-crystalline structure; and a layered film which is made from the first and second hafnium-containing silicon oxide nitride layers that are layered on the semiconductor substrate, and which has a nitrogen ratio of 15-40 atomic percent.

Moreover, with regard to the above-described dielectric film layered product, it is preferable that the first hafnium-containing silicon oxide nitride layer be set on the second hafnium-containing silicon oxide nitride layer.

Moreover, with regard to the above-described dielectric film layered product, it is possible flat the second hafnium-containing silicon oxide nitride layer be set on the first hafnium-containing silicon oxide nitride layer.

Furthermore, with regard to the above-described dielectric film layered product, it is preferable that the first hafnium-containing silicon oxide nitride layer has a crystal size of 1-5 nm.

Furthermore, with regard to the above-described dielectric film layered product, it is preferable that the crystal size of the first hafnium-containing silicon oxide nitride layer is obtained based on a diffraction peak of (111) of a diffraction pattern obtained by applying an in-plane-X-ray diffraction measuring method.

Next, another aspect of the present invention is, for example, a production method of a dielectric film layered product including: a microcrystalline layer forming step for forming a first hafnium-containing silicon oxide nitride layer made from a microcrystalline structure; and a non-crystalline layer forming step for forming a second hafnium-containing silicon oxide nitride layer made from a non-crystalline structure, wherein the microcrystalline layer forming step is conducted before the non-crystalline layer forming step.

Next, another aspect of the present invention is, for example, a production method of a dielectric film layered product including: a microcrystalline layer forming step for forming a first hafnium-containing silicon oxide nitride layer made from a microcrystalline structure; and a non-crystalline layer forming step for forming a second hafnium-containing silicon oxide nitride layer made from a non-crystalline structure, wherein the microcrystalline layer forming step is conducted after the non-crystalline layer forming step.

Moreover, with regard to the above-described production method of a dielectric film layered product, it is preferable that the microcrystalline layer forming step include steps of: forming a first hafnium-containing silicon oxide layer made from a non-crystalline structure; and annealing the first hafnium-containing silicon oxide layer in an oxide or argon atmosphere.

Moreover, with regard to the above-described production method of a dielectric film layered product, it is preferable that a ratio between Si and Hf of the first hafnium-containing silicon oxide layer calculated by using a formula (Si/(Hf+Si)) be in a range of less than 50 atomic percent and more than 0 atomic percent.

Moreover, with regard to the above-described production method of a dielectric film layered product, it is preferable that the non-crystalline layer forming step include steps of: forming a second hafnium-containing silicon oxide layer made from a non-crystalline structure; and nitriding the first hafnium-containing silicon oxide layer in an ammonia or plasma atmosphere.

Moreover, with regard to the above-described production method of a dielectric film layered product, it is preferable that a ratio between Si and Hf of the second hafnium-containing silicon oxide layer calculated by using a formula (Si/(Hf+Si)) be in a range of less than 50 atomic percent and more than 0 atomic percent.

Another aspect of the present invention is, for example a semiconductor apparatus including a MOS transistor, wherein the MOS transistor includes a gate dielectric film which is the above-described dielectric film layered product.

Another aspect of the present invention is, for example, a semiconductor apparatus production method including a MOS transistor forming step on the semiconductor apparatus, wherein a gate dielectric film of the MOS transistor formed in the MOS transistor forming step is produced by applying the above-described production method of a dielectric film layered product.

In accordance with the above-described dielectric film layered product, both the hafnium-containing silicon oxide nitride layer made from the microcrystalline structure and the hafnium-containing silicon oxide nitride layer made from the nor-crystalline structure are layered, and therefore, it is possible to increase the dielectric constant of the overall dielectric film layered products to lower the leak current of the semiconductor substrate, and to increase ability of preventing boron leakage. Moreover, because the nitrogen ratio of the dielectric film layered product is adjusted to be in the range of 15-40 at. %. Therefore, it is possible to increase ability of preventing boron leakage furthermore.

Moreover, in accordance with the above-described dielectric film layered product, the hafnium-containing silicon oxide nitride layer is made from a microcrystalline structure and has a crystal size in the rage of 1-5 nm. Therefore, it is possible to greatly reduce the gate leak current.

Moreover, in accordance with the above-described production method of the dielectric film layered product, the hafnium-containing silicon oxide nitride layer made from a microcrystalline structure is layered after or before the hafnium-containing silicon oxide nitride layer made from a non-crystalline structure is layered, and therefore, it is possible to lower the leak current of the semiconductor substrate, and it is possible to produce the dielectric film layered product which has an increased ability of preventing boron leakage.

Moreover, by applying the above-described production method of the dielectric film layered product, the first hafnium-containing silicon oxide layer is annealed after forming the first hafnium-containing silicon oxide layer made from a non-crystalline structure. Therefore, it is possible to change the first hafnium-containing silicon oxide layer made from a non-crystalline structure to a layer made from the microcrystalline structure. Moreover, a ratio between Si and Hf of the first hafnium-containing silicon oxide layer calculated by using a formula (Si/(Hf+Si)) is in a range of less than 50 atomic percent and more than 0 atomic percent. Therefore, it is possible to increase the dielectric constant of the dielectric film layered product further.

Moreover, by applying the above-described production method of the dielectric film layered product the second hafnium-containing silicon oxide layer is nitrided in an ammonia atmosphere or a plasma atmosphere after forming the hafnium-containing silicon oxide layer which is made from a non-crystalline structure. Therefore, it is possible to change the second hafnium-containing silicon oxide layer to the hafnium-containing silicon oxide nitride layer made from the non-crystalline structure. Moreover, a ratio between Si and Hf of the second hafnium-containing silicon oxide layer calculated by using a formula (Si/(Hf+Si)) is in the range of less than 50 atomic percent and more than 0 atomic percent, and the nitrogen ratio of the layered film is set to be in the range of 15-40 atomic percent. Therefore, it is possible to prevent boron leakage.

Next, in accordance with the above-described semiconductor apparatus, the above-described dielectric film layered product is applied as the gate dielectric film. Therefore, the dielectric constant of the gate dielectric film is improved, and EOT (Equivalent Oxide Thickness) can be thin. When applying the same EOT and producing three types of the semiconductor substrates by using the above-described dielectric film layered product, a non-crystalline film and a crystalline film, it is possible to control the leak current so as to be the lowest among three substrates by using the semiconductor substrate obtained from the above-described dielectric film layered product. Moreover, it is possible to prevent boron included in the gate terminal from being diffused by heating inside the gate dielectric film and from entering into the semiconductor substrate, that is, it is possible to prevent boron leakage.

Moreover, in accordance with the above-described production method of the semiconductor apparatus, the above-described dielectric film layered product is formed as the gate dielectric film. Therefore, it is possible to produce the semiconductor apparatus which can prevent both the leak current and boron leakage.

The present invention provides a dielectric film which can avoid both boron leakage and increase of leak current, a semiconductor apparatus which has the dielectric film, a production method of the dielectric film and a production method of the semiconductor apparatus.

DETAILED DESCRIPTION OF THE INVENTION

An Example of the Semiconductor Apparatus

Figure 1:
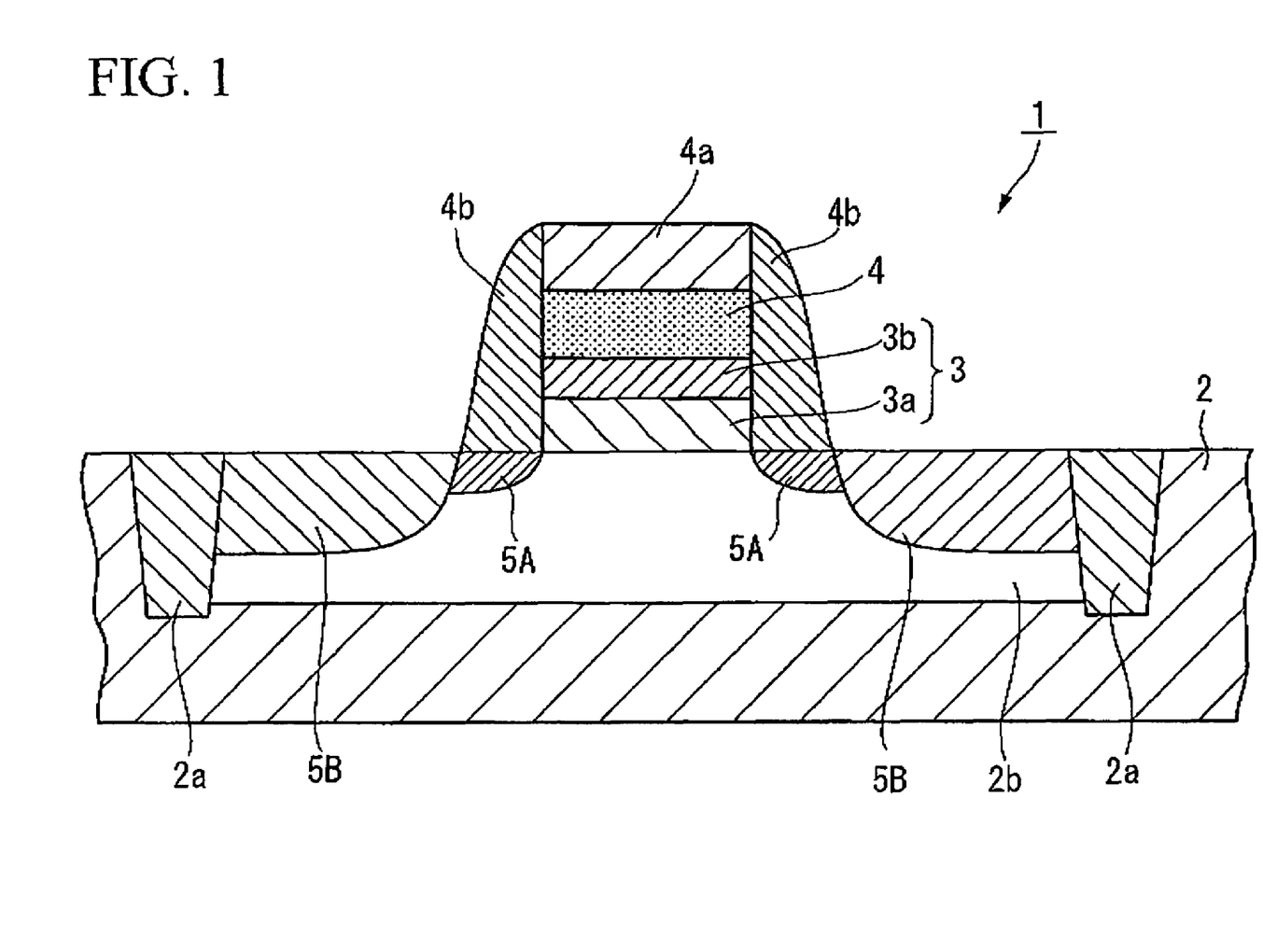
FIG. 1 is an outline cross-section which shows characteristic portions of a semiconductor apparatus of one embodiment.

Hereinafter, one embodiment is explained with reference to drawings. In this embodiment an example is explained in which a MOS (metal-oxide semiconductor) transistor is applied to the semiconductor apparatus. FIG. 1 is an outline drawing which is a constitution of the MOS transistor shown as a cross-section that is the semiconductor apparatus of this embodiment. It should be noted that drawings referred to in the following explanations are used for explaining the semiconductor apparatus and the production method of the semiconductor apparatus. Therefore, length, depth, width, heights thickness, and the like are not necessarily the same as a real semiconductor apparatus.

The semiconductor apparatus shown in FIG. 1 is a MOS transistor 1 which is constituted from a semiconductor substrate 2, a gate dielectric film 3 formed on the semiconductor substrate 2, a gate terminal 4 formed as a layer on the gate dielectric film 3, source/drain contact areas 5A which are embedded into both sides of the gate terminal 4 of the semiconductor substrate 2 and a source/drain concentrated area 5B.

The semiconductor substrate 2 is constituted from an n-type semiconductor which is made by adding, for example, an n-type impurity as a dopant to a silicon single crystal. Moreover, on the semiconductor substrate 2, an element isolation dielectric film 2a is formed which isolates an active region. The element isolation dielectric film 2a is formed on an area of the semiconductor substrate 2 that is not the active area by applying the STI (Shallow Trench isolation) method, and isolates the neighboring active area so as to be dielectric. Moreover, a p-type diffusion layer 2b (p-well) is formed on the semiconductor substrate 2.

On the p-type diffusion layer 2b, the gate dielectric film 3 and the gate terminal 4 are formed.

The gate dielectric film 3 is one example of a dielectric film layered product of the present invention, and is constituted to have layers including: a hafnium-containing silicon oxide nitride layer 3a which has a microcrystalline structure (hereinafter, microcrystalline layer 3a); and a hafnium-containing silicon oxide nitride layer 3b which has a non-crystalline structure (hereinafter, non-crystalline layer 3b).

The microcrystalline layer 3a has approximately 1-9 nm thickness and is constituted from hafnium (Hf), silicon (Si), oxygen (O) and nitrogen (N). The ratio between Si and Hf included in the microcrystalline layer 3a calculated in accordance with the formula (Si/(Hf+Si)) is in the range of less than 50 at. % (atomic percent) and more than 0 at. %, and more preferably in the range of 40 at. % or less and 30 at. % or more. If the ratio obtained by (Si/(Hf+Si)) is in such a range, it is possible to improve the dielectric constant, and therefore, it is possible to prevent leak current. On the other hand, the microcrystalline layer 3a has a structure made by gathering very small crystal grain, and the crystal grain has an average diameter (crystal size) which is in the range of 1-5 nm. If the crystal size is in such a range, it is possible to greatly reduce the gate leak current. It should be noted that it is possible to measure the crystal size by measuring X-ray diffraction pattern of the microcrystalline layer 3a in accordance with an in-plane-X-ray diffraction measuring method, and the crystal size is obtained based on a diffraction peak of (111) of the obtained diffraction pattern.

On the other hand, the microcrystalline layer 3b has approximately 0.5-5 nm thickness and, similar to the microcrystalline layer 3a, is constituted from hafnium (Hf), silicon (Si), oxygen (O) and nitrogen (N). The ratio between Si and Hf included in the non-crystalline layer 3b calculated in accordance with the formula (Si/(Hf+Si)) is in the range of less than 50 at. % and more than 0 at. %, and more preferably in the range of 40 at. % to 30 at. %. If the ratio obtained by (Si/(Hf+Si)) is in such a range, it is possible to improve a dielectric constant, and therefore, it is possible to prevent leak current. Moreover, the non-crystal layer 3b is constituted as a whole, from non-crystalline phasis. If the X-ray diffraction pattern of the non-crystalline layer 3b is measured, for example, in accordance with an in-plane-X-ray diffraction measuring method, no diffraction peak is found or a very broad peak is found even if the diffraction peak is detected. Therefore, there is no grain boundary in the non-crystalline layer 3b because the non-crystalline layer 3b is constituted as a whole from non-crystalline phasis, and it is possible to prevent boron leakage.

Moreover, a nitrogen ratio of the overall gate dielectric film 3 is preferably in a range of 15-40 at. %, and more preferably in the range of 20-30 at. %. If the nitrogen ratio is less than 15 at. %, the ability to prevent boron leakage with regard to the semiconductor substrate 2 is greatly deteriorated, and therefore, it is not preferable. If the nitrogen ratio is more than 40 at. %, chemical stability of the gate dielectric film 3 is greatly deteriorated, and therefore, it is not preferable. As described later, it is possible to adjust the nitrogen ratio of the gate dielectric film 3 by changing conditions of a nitriding operation of production steps of forming non-crystalline layer in accordance with needs, requirements, the environment, and the like.

Next, the gate terminal 4 is formed as a multiple layered film which is constituted from a polysilicon film set on a metallic film both of which are layered on the gate dielectric film 3. With regard to the polysilicon film, it is possible to apply a doped polysilicon film which is formed by doping impurity such as boron when a film is formed in accordance with the CVD (Chemical Vapor Deposition) method. Moreover, with regard to the metallic film, it is possible to apply metal which has a high melting point such as tungsten (W) and tungsten silicide (WSi).

Moreover, the gate terminal 4 is covered with an upper dielectric film 4a made from, for example, silicon nitride, and a sidewall which is made from, for example, a silicon oxide film 4b is formed at a side of the gate terminal 4.

On the semiconductor substrate 2 under the silicon oxide film 4b which constitutes the sidewall, a source/drain contact area 5A is formed. The source/drain contact area 5A is formed by ion implantation of n-type impurity such as arsenic.

Moreover, outside of the source/drain contact area 5A, a source/drain concentrated area 5B is formed. Similar to the source drain contact area 5A, the source/drain concentrated area 5B is formed by ion implantation of an n-type impurity such as arsenic. With regard to concentration of the n-type impurity, the source/drain concentrated area 5B is higher than the source/drain contact area 5A. A source/drain area is constituted from the source/drain contact area 5A and the source/drain concentrated area 5B.

"Production Method of Semiconductor Apparatus"

Figure 2:
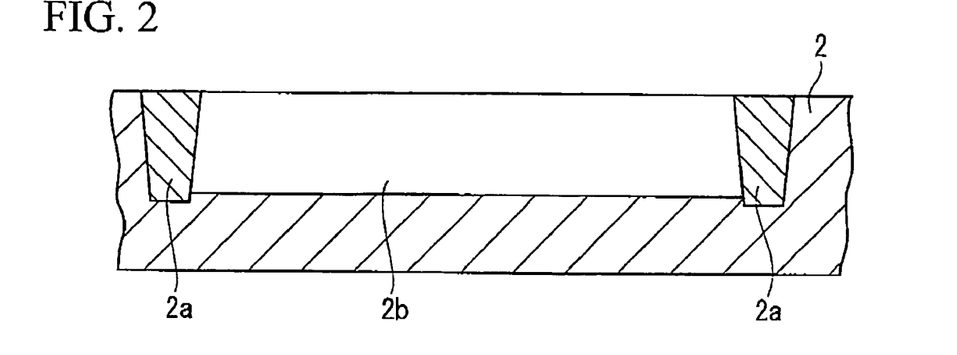
FIG. 2 is a drawing for explaining a production method of a semiconductor apparatus of one embodiment, and is an outline cross-section which shows production steps of an element isolation dielectric film.
Figure 3:
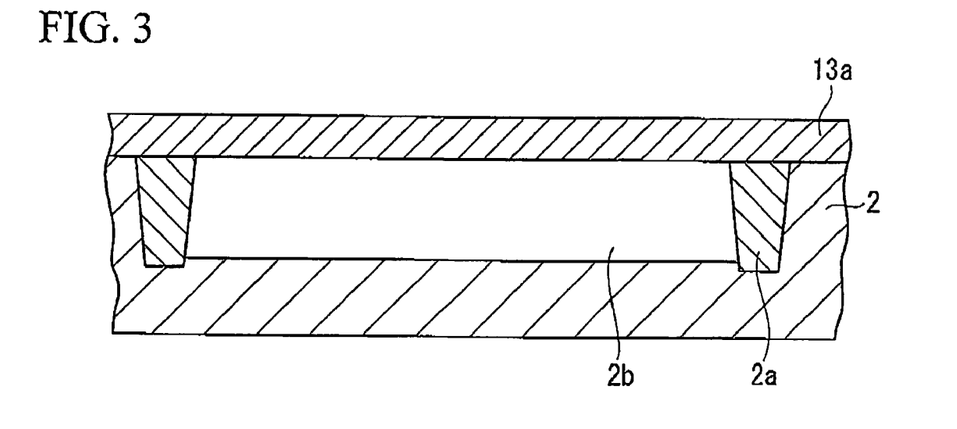
FIG. 3 is a drawing for explaining a production method of a semiconductor apparatus of one embodiment, and is an outline cross-section which shows forming steps of a microcrystalline layer.
Figure 4:
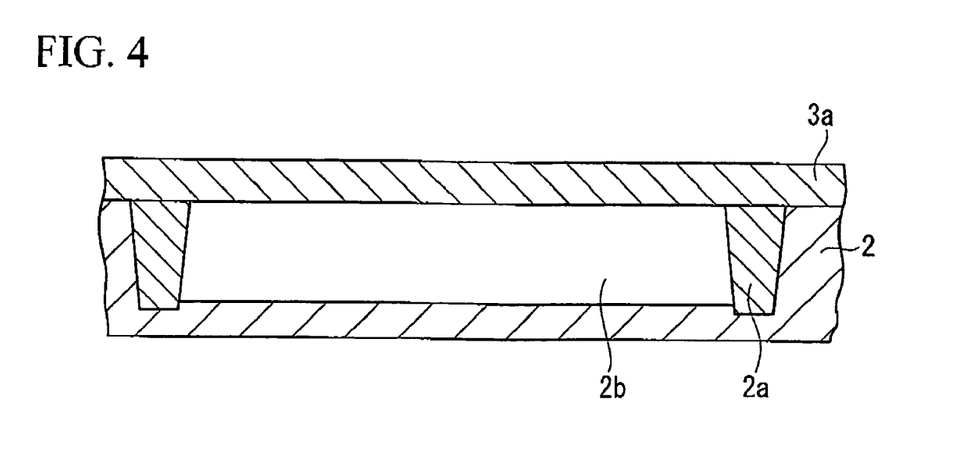
FIG. 4 is a drawing for explaining a production method of a semiconductor apparatus of one embodiment, and is an outline cross-section which shows forming steps of a microcrystalline layer.
Figure 5:
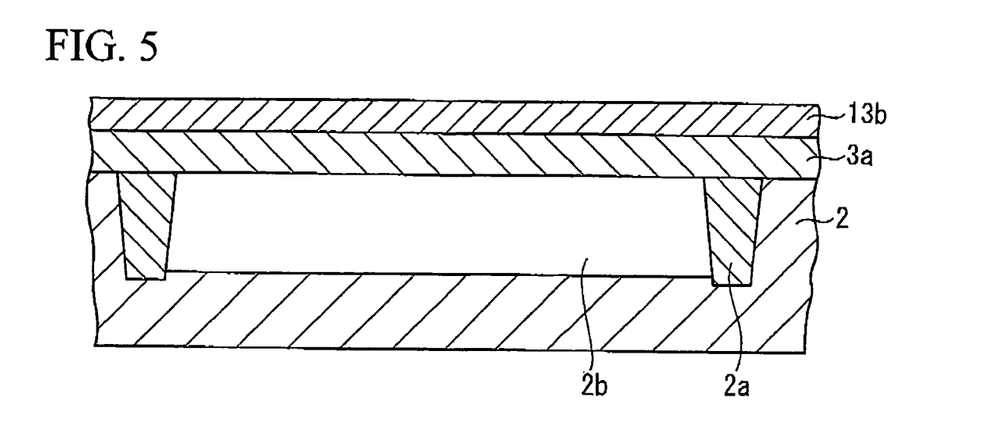
FIG. 5 is a drawing for explaining a production method of a semiconductor apparatus of one embodiment, and is an outline cross-section which shows forming steps of a non-crystalline layer.
Figure 6:
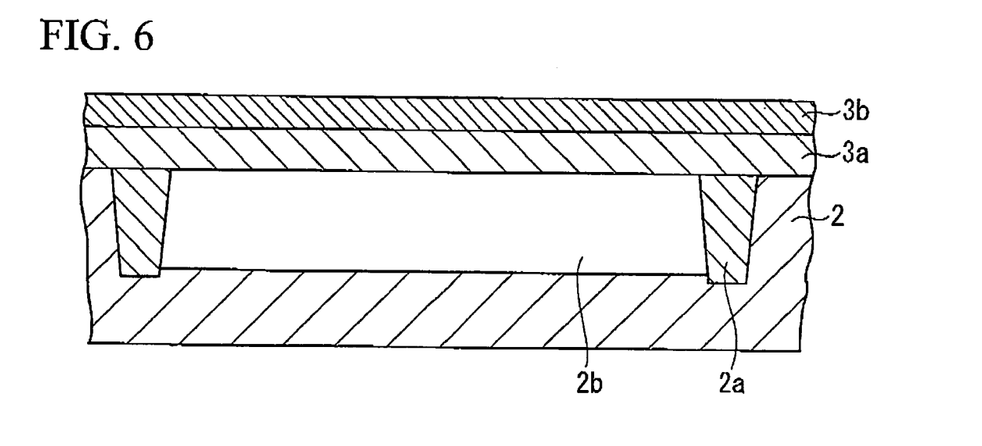
FIG. 6 is a drawing for explaining a production method of a semiconductor apparatus of one embodiment, and is an outline cross-section which shows forming steps of a non-crystalline layer.
Figure 7:
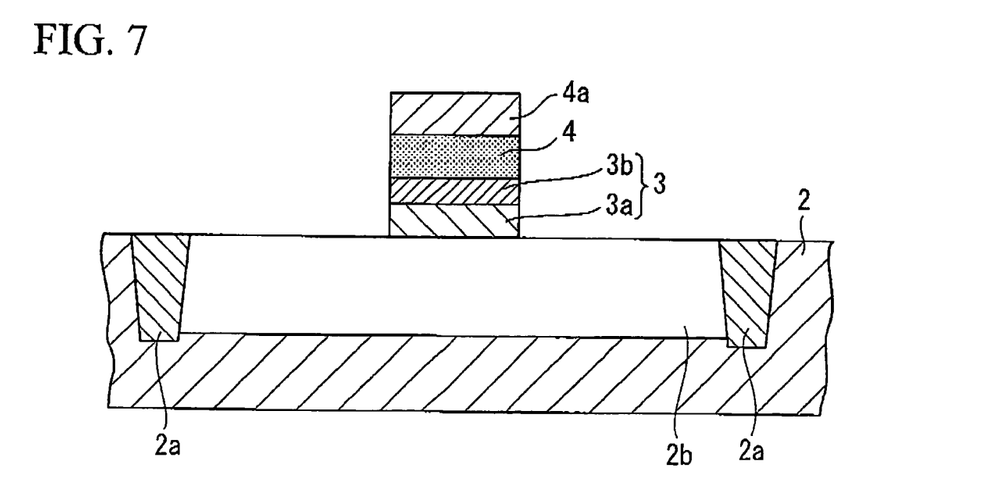
FIG. 7 is a drawing for explaining a production method of a semiconductor apparatus of one embodiment, and is an outline cross-section which shows forming steps of a gate electrode and a gate dielectric film.
Figure 8:
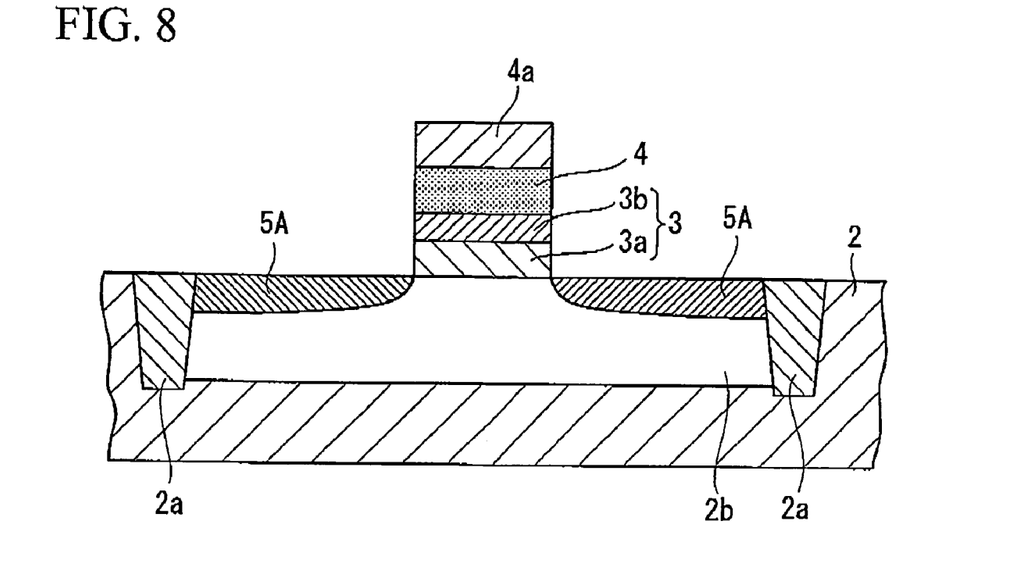
FIG. 8 is a drawing for explaining a production method of a semiconductor apparatus of one embodiment, and is an outline cross-section which shows forming an n-type source/drain area.
Figure 9:
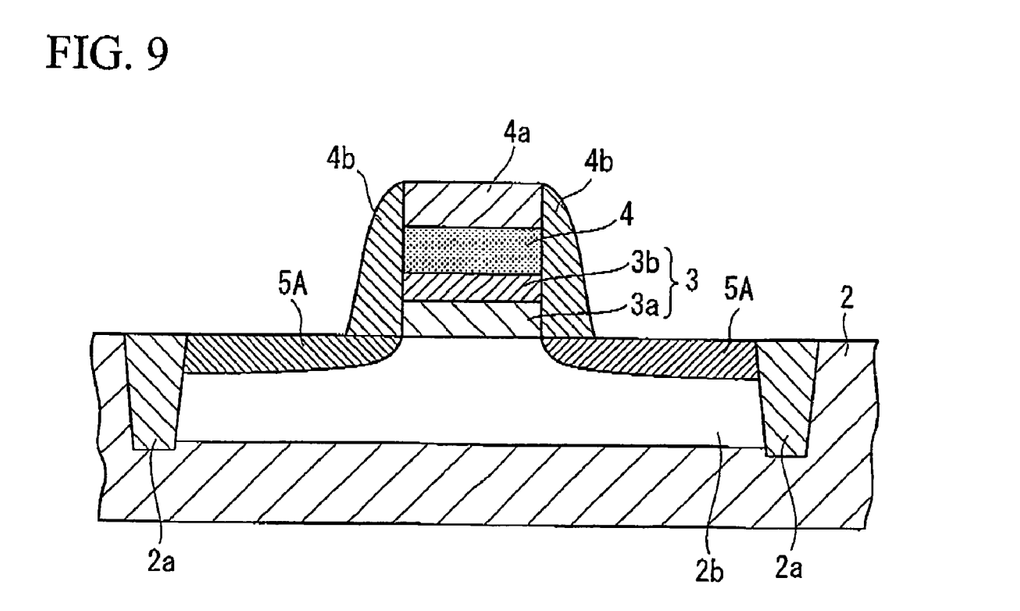
FIG. 9 is a drawing for explaining a production method of a semiconductor apparatus of one embodiment, and is an outline cross-section which shows forming a sidewall.
Figure 10:
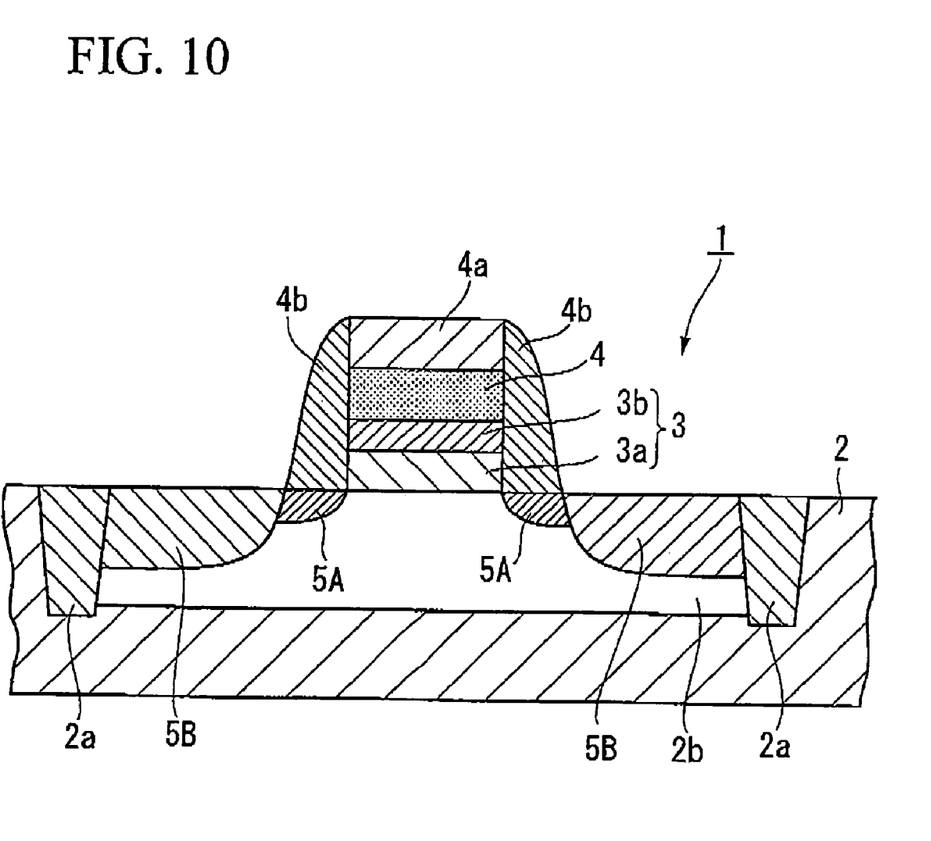
FIG. 10 is a drawing for explaining a production method of a semiconductor apparatus of one embodiment, and is an outline cross-section which shows forming an n-type source/drain area.

Next, in reference to FIGS. 2-10, a production method of the MOS transistor 1 (semiconductor apparatus) shown in FIG. 1 is explained. FIGS. 2-10 are drawings for explaining a production method of the MOS transistor 1. FIG. 2 shows a forming step of the element isolation dielectric film 2a. FIGS. 3 and 4 show a microcrystalline layer forming step. FIGS. 5 and 6 show a non-crystalline layer forming step. Moreover, FIG. 7 shows a forming step of the gate terminal 4 and the gate dielectric film 3. FIG. 8 shows a forming step of the source/drain contact area 5A. FIG. 9 shows a forming step of the sidewall (silicon nitride film 4b). FIG. 10 shows a forming step of source/drain concentrated area 5B.

(Forming Step of Element Isolation Dielectric Film 2a)

First, as shown in FIG. 2, the element isolation dielectric film 2a is formed on the semiconductor substrate 2. The element isolation dielectric film 2a is formed in accordance with the STI (Shallow Trench Isolation) method, and is made from silicon oxide which has a depth of approximately 200-350 nm. The element isolation dielectric film 2a is formed in order to form an active area on the semiconductor substrate 2. Next, a p-type diffusion layer (p-type well) 2b is formed by putting boron into the semiconductor substrate 2. It is possible to conduct a heating operation in order to recover damage after putting boron into the semiconductor substrate 2.

(Microcrystalline Layer Forming Step)

Next, as shown in FIG. 3, a first hafnium-containing silicon oxide layer 13a which is made from a non-crystalline structure is formed on the semiconductor substrate 2. It is preferable to produce the first hafnium-containing silicon oxide layer 13a in accordance with MOCVD method or ALD method, and moreover, MOCVD method is especially preferable. With regard to reaction gas, for example, it is possible to apply reaction gas obtained by mixing following silicon source gas and hafnium source gas.

As silicon source gas, it is possible to apply $Si_2H_6SiH_4$, $Si(MMP)_4$((Tetrakis 1-Methoxy-2-Methyl-2-Propoxy Silane)$Si[OC(CH_3)_2CH_2OCH_3]_4$), $Si(DMAP)$((Tetrakis 1-(N,N-dimethylamino)-2Propoxy Silane)$Si[(OCH(CH_3)CH_2N(CH_3)_2]_4$), TDMASi(Tetrakis diemethyl amido Silane) $Si[N(CH_3)_2]_4$), or the like.

As a hafnium source gas, it is possible to apply THB ((Hafnium tetra-t-butoxide)$Hf[OC(CH_3)_3]_4$), TDEAH((Tetrakis diethylamido hafnium)$C_{16}H_{40}N_4Hf$), TDMAH((Tetrakis dimethlamino hafnium)$C_8H_{24}N_4Hi$), $Hf(MMP)_4$ ((Tetrakis 1-methoxy-2-methyl-2-propoxy hafnium)$Hf[OC(CH_3)_2CH_2OCH_3]_4$), $Hf(NO_3)_4$, or the like.

It should be noted that there is no limitation of combining the above-described silicon source gas and hafnium source gas. However, it is preferable to use $Si_2H_6$ as a silicon source and THB as a hafnium source.

There is no limitation of a flow ratio between the silicon source gas and the hafnium source gas. However, it is preferable to adjust the flow ratio between Si and Hf of the hafnium-containing silicon oxide layer 13a calculated in accordance with a formula (Si/(Hf+Si)) so as to be in the range of less than 50 at. % (atomic percent) and more than 0 at. %, and more preferably in a range of 20-45 at. %.

Moreover, in the reaction gas, it is possible to include a carrier gas such as oxidizing gas, for example, oxygen. Furthermore, substrate temperature of the semiconductor substrate 2 can be, for example, approximately 300° C.

In the first hafnium-containing silicon oxide layer 13a formed in accordance with the above-described steps, almost all portions of the structure are non-crystalline phasis, or large portions of the structure are non-crystalline phasis and a portion of crystalline phasis is deposited. It is preferable that the film thickness of the first hafnium-containing silicon oxide layer 13a is appropriately in the range of 1-9 nm.

Next, as shown in FIG. 4, the first hafnium-containing silicon oxide layer 13a formed in the above-described steps is annealed in an atmosphere such as nitrogen, oxygen or argon. It is preferable that an annealing temperature be, for example, approximately 900° C.

By conducting such an annealing operation, the first hafnium-containing silicon oxide 13a is microcrystallized so as to be a microcrystalline structure (microcrystalline layer 3a). It should be noted that it is preferable to adjust the annealing temperature in this operation so as to obtain the crystal size in approximately 1-5 nm.

(Non-Crystalline Layer Forming Step)

Next, as shown in FIG. 5, a second hafnium-containing silicon oxide layer 13b which is made from a non-crystalline structure is formed. Same as the microcrystalline layer forming step, it is preferable to produce the second hafnium-containing silicon oxide layer 13b in accordance with the MOCVD method or the ALD method, the MOCVD method being especially preferable. With regard to reaction gas used in the MOCVD method, for example, it is possible to apply the above-described reaction gas obtained by mixing the silicon source gas and hafnium source gas.

It should be noted that there is no limitation of combining the above-described silicon source gas and hafnium source gas. However, it is preferable to use $Si_2H_6$ as silicon source and THB as hafnium source.

There is no limitation with regard to the flow ratio between silicon source gas and hafnium source gas. However, it is preferable to adjust the flow ratio between Si and Hf of the hafnium-containing silicon oxide layer 13b calculated in accordance with the formula (Si/(Hf+Si)) so as to be in a range of less than 50 at. % (atomic percent) and more than 0 at. %, and more preferably in the range of 30-40 at. %.

Moreover, in the reaction gas, it is possible to include carrier gas such as oxidizing gas, for example, oxygen. Furthermore, substrate temperate of the semiconductor substrate 2 can be, for example, approximately 300° C.

In the second hafnium-containing silicon oxide layer 13b formed in accordance with the above-described steps, almost all portions of the structure are non-crystalline phasis. It is preferable that the film thickness of the second hafnium-containing silicon oxide layer 13b be appropriately 0.5-5 nm.

Next as shown in FIG. 6, the second hafnium-containing silicon oxide layer 13b formed in the above-described steps is nitrided in ammonia atmosphere or plasma atmosphere. The second hafnium-containing silicon oxide layer 13b is nitrided in ammonia, for example, in a condition of 700° C. for 30 minutes. In accordance with the above-described nitriding operation, the second hafnium-containing silicon oxide layer 13b is nitrided while having non-crystalline structure, and therefore, it is possible to obtain the hafnium-containing silicon oxide nitride layer 3b (non-crystalline layer 3b).

Moreover, in the above-described operation, nitride atoms go into the first hafnium-containing silicon oxide layer 13a (microcrystalline layer 3a), and therefore, nitrogen ratio of the microcrystalline layer 3a is increased. Therefore, overall nitrogen ratio of both the microcrystalline layer 3a and the non-crystalline layer 3b is in a range of approximately 15-40%.

In accordance with the above-described steps, a multiple layered film including the microcrystalline layer 3a and the non-crystalline layer 3b is formed.

(Forming Step of Gate Terminal 4 and Gate Dielectric Film 3)

Next, on the non-crystalline layer 3b, a polysilicon film including a p-type impurity such as boron is formed in accordance with the CVD method. Moreover, on the polysilicon film, a refractory metallic film such as tungsten, tungsten nitride, tungsten silicide is formed in accordance with a spattering method. In a later production step, a gate terminal is formed from both the polysilicon film and the refractory metallic film. Moreover, a silicon nitride film is formed on the refractory metallic film.

After that, a patterning operation is conducted on the microcrystalline layer 3a, the non-crystalline layer 3b, the polysilicon film, the refractory metallic film and the silicon nitride film by using a photolithography technique and etching technique, and as shown in FIG. 7, the gate dielectric film 3, the gate terminal 4 and the upper dielectric film 4a are formed.

(Forming Step of Source/Drain Contact Area 5A)

Next, as shown in FIG. 8, ion-implantation of an n-type impurity (for example, arsenic: As) is conducted by using the gate terminal 4 as a mask, an annealing operation is conducted in a nitrogen atmosphere, and finally, the source/drain contact area 5A is obtained.

(Production Step of Sidewall)

Next, a silicon oxide film is formed so as to cover the semiconductor substrate 2 and the gate terminal 4, and after that, surface of the semiconductor substrate is exposed by anisotropic etching. In accordance with such an operation, as shown in FIG. 9, the sidewall made from the silicon oxide film 4b is formed.

(Production Step of Source/Drain Concentrated Area 5B)

Next, as shown in FIG. 10, ion implantation of a concentrated n-type impurity (for example, arsenic: As) is conducted by using the gate terminal 4 and the sidewall (silicon oxide film 4b) as a mask, an annealing operation is conducted in nitrogen atmosphere, and finally, the source/drain concentrated area 5B is obtained.

In accordance with the above-described steps, the MOS transistor 1 shown in FIG. 1 is produced.

"Another Example of Semiconductor Apparatus"

Figure 11:
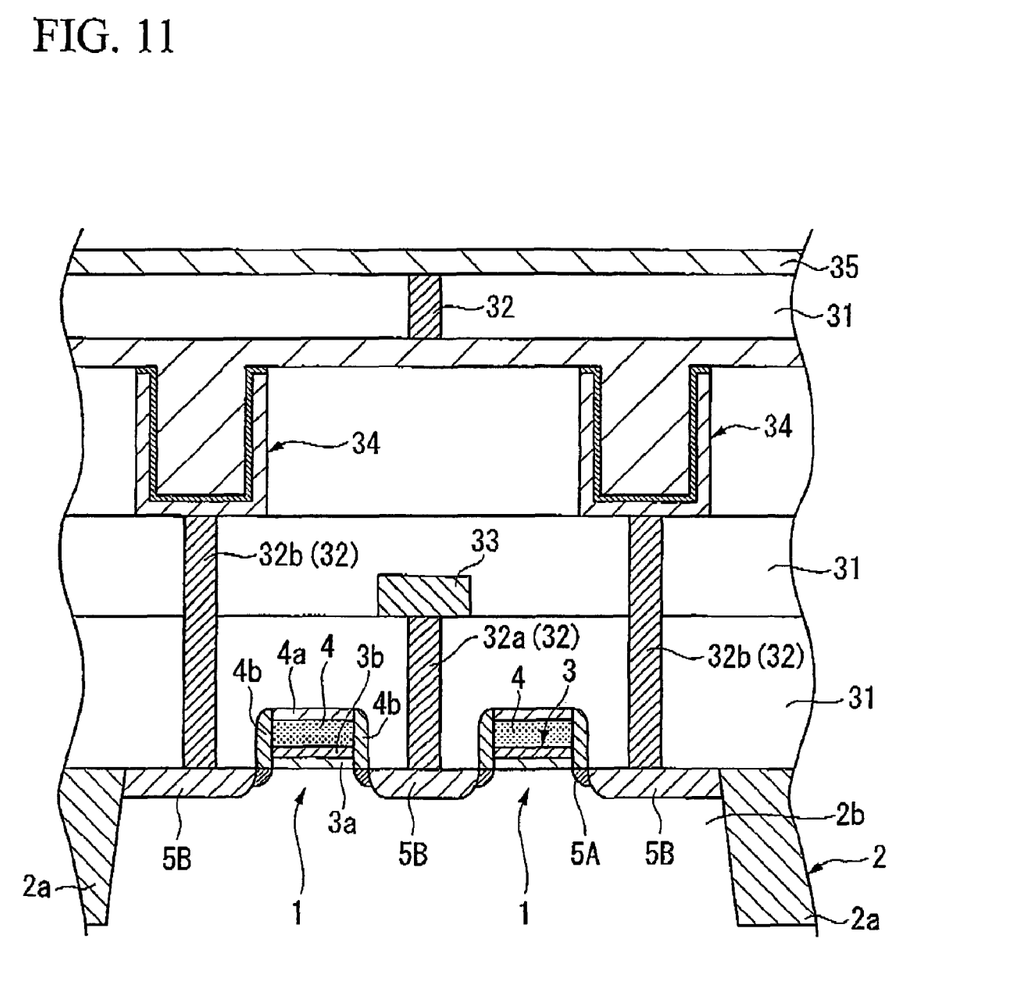
FIG. 11 is an outline cross-section which shows an example in which a semiconductor apparatus of one embodiment is applied to a DRAM device.

FIG. 11 is an outline cross-section of a DRAM device providing the above-described MOS transistor 1.

The DRAM (dynamic random access memory) device shown in FIG. 11 has a constitution in which multiple interlayer dielectric films 31 are layered on the semiconductor substrate 2, and the DRAM device has contact plugs 32 (including a bit line contact 32a and storage node contacts 32b) which are inserted through the interlayer dielectric films 31, bit line 33, a cell capacitor 34, wirings 35, and the like.

The MOS transistor 1 shown in FIG. 1 is formed on the semiconductor substrate 2. The MOS transistor 1 has the gate terminal 4 and the gate dielectric film 3 which is set between the gate terminal 4 and the semiconductor substrate 2. Moreover, the gate dielectric film 3 is constituted from both the microcrystalline layer 3a and the non-crystalline layer 3b. Due to the gate dielectric film 3, it is possible to control the gate leak current so as to be low, and moreover, it is possible to prevent boron included in the gate terminal 4 as dopant from diffusing into the semiconductor substrate 2.

As described above, the gate dielectric film 3 has a constitution in which both the hafnium-containing silicon oxide nitride layer 3a made from microcrystalline structure and the hafnium-containing silicon oxide nitride layer 3b made from a non-crystalline structure are layered, and therefore, it is possible to increase the dielectric constant of the overall gate dielectric film 3 it is possible to lower the leak current of the semiconductor substrate 2, and it is possible to increase the ability of preventing boron leakage. Moreover, the nitrogen ratio of the gate dielectric film 3 is adjusted to be in the range of 15-40 at, %. Therefore, it is possible to further increase the ability of preventing boron leakage furthermore.

Moreover, with regard to the above-described gate dielectric film 3, the hafnium-containing silicon oxide nitride layer 3a is made from a microcrystalline structure and has a crystal size in the range of 1-5 nm. Therefore, it is possible to greatly reduce the gate leak current.

Moreover, with regard to the above-described production method of the gate dielectric film 3, both the hafnium-containing silicon oxide nitride layer 3a made from a microcrystalline structure and the hafnium-containing silicon oxide nitride layer 3b made from a non-crystalline structure are layered, and therefore, it is possible to lower the leak current semiconductor substrate 2, and it is possible to obtain the gate dielectric film 3 which has an increased ability of preventing boron leakage.

Moreover, with regard to the above-described production method of the gate dielectric film 3, the first hafnium-containing silicon oxide layer 13a is annealed after forming the hafnium-containing silicon oxide layer in the microcrystalline layer forming step. Therefore, it is possible to change the non-crystalline structure to the microcrystalline structure.

Moreover, with regard to the above-described production method of the gate dielectric film 3, with regard to the non-crystalline layer forming step, the second hafnium-containing silicon oxide layer 13b is nitrided in an ammonia atmosphere or a plasma atmosphere after forming the hafnium-containing silicon oxide layer which is made from non-crystalline structure. Therefore, it is possible to obtain the hafnium-containing silicon oxide nitride layer from the hafnium-containing silicon oxide layer.

Next, the above-described gate terminal 3 is applied to the above-described MOS transistor 1 and the DRAM device. Therefore, the dielectric constant of the gate dielectric film 3 is improved, and EOT (Equivalent Oxide Thickness) can be thin. In a condition of applying the same EOT and producing three types of the semiconductor substrates 2 by using the above-described dielectric film layered product (gate dielectric film 3), a non-crystalline film and a crystalline film, it is possible to control the leak current so as to be the lowest among three substrates by using the semiconductor substrate 2 obtained from the above-described dielectric film layered product. Moreover, it is possible to prevent boron included in the gate terminal 4 from being diffused by heating inside the gate dielectric film 3 and from entering into the semiconductor substrate 2, that is, it is possible to prevent a boron leakage.

Moreover, in accordance with the above-described production method of the MOS transistor 1, the gate dielectric film 3 is formed. Therefore, it is possible to produce the MOS transistor 1 or the DRAM device which can prevent both the leak current and boron leakage.

It should be noted that these are exemplary of the invention and are not to be considered as limitations. Additions, omissions, substitutions, and other modifications can be made without departing from the spirit or scope of the present invention. For example, it is possible to apply the above-described dielectric film layered product not only to the MOS transistor for selecting the memory cell of the DRAM device, but also to the MOS transistors of peripheral circuits of the DRAM device.

Moreover, in the above-described embodiments, on the semiconductor substrate 2, an example is explained in which the microcrystalline layer 3a is set on the non-crystalline layer 3b. However, it is possible to change the order of two layers, for example, forming the non-crystalline layer on the semiconductor substrate and after that, the microcrystalline layer is formed on the non-crystalline Layer.

Example 1

In order to evaluate the above-described dielectric film layered product, TEG (Test Element Group) having a gate dielectric film of nMOSFET (n-channel metal-oxide-semiconductor field effects transistor) which was the dielectric film layered product was produced.

First, an, element isolation dielectric film such as STI (Shallow Trench Isolation) was embedded and formed on the p-type silicon semiconductor substrate, After that, a p-type well was formed by a channel ion-implantation of boron and/or the like to a surface of the exposed silicon semiconductor substrate.

Next, a gate dielectric film and a gate terminal were formed by being layered on the silicon semiconductor substrate. This gate dielectric film was formed in accordance with the above-described production method.

That is, $Si_2H_6$ was applied as silicon source gas, THB was applied as hafnium source gas, and the first hafnium-containing silicon oxide layer which had a non-crystalline structure was formed so as to have a thickness of 2 nm in accordance with the MOCVD method in a condition of a substrate temperature of 300° C. It should be noted that the flow ratio was adjusted so as to set a ratio of (Si/(Hf+Si)) to 25%.

Next, in order to form the microcrystalline layer, the first hafnium-containing silicon oxide layer had a microcrystalline structure due to a post annealing operation in a condition of heating at 900° C. in nitrogen atmosphere for 10 seconds.

Next, $Si_2H_6$ was applied as silicon source gas, THB was applied as hafnium source gas, and the second hafnium-containing silicon oxide layer which had a non-crystalline structure was formed so as to have a thickness of 2 nm in accordance with MOCVD method in a condition of a substrate temperature of 300° C. It should be noted that the flow ratio is adjusted so as to set the ratio of (Si/(Hf+Si)) to 60%.

Next, a nitride operation is conducted in a condition of a temperature of 700° C. for 30 minutes, and a hafnium-containing silicon oxide nitride layer was formed.

In accordance with the above-described steps, the gate dielectric film of the above-described embodiment was formed.

Moreover, a gate terminal was formed by using a polycrystalline semiconductor film. It should be noted that it is possible to use not only polycrystalline semiconductor, but also a polycrystalline semiconductor germanium (polySiGe) film, other metallic materials, and the like.

After that, a photoresist was painted on the gate terminal, and a patterning operation was conducted so as to be a shape of the gate terminal. Next, by using the patterned photoresist as a mask, an etching operation was conducted on both the gate dielectric film and the gate terminal on the gate dielectric film in order to form a gate structure. After that, by using the gate terminal as a mask, an ion implantation of such as arsenic was conducted on a surface area of the silicon semiconductor substrate in order to form an n-type source/drain contact area.

Next, in accordance with CVD method, a silicon oxide film ($SiO_2$) was sedimented on the silicon semiconductor substrate so as to cover an overall surface of the gate terminal. Next, a sidewall dielectric film was formed on a side of the gate terminal by conducting an etchback of the silicon oxide film in accordance with such as RIE (Reactive Ion Etching).

After that, by using the side dielectric film as a mask, an ion implantation of phosphorous, arsenic, or the like was conducted on a surface area of the silicon semiconductor substrate in order to form an n-type source/drain concentrated area. An n-type source/drain area was formed from both the source/drain contact area and the source/drain concentrated area.

Next, a metallic film of cobalt (Co), nickel (Ni), and/or the like was sedimented on a surface of the silicon semiconductor substrate. Next, the metallic film sedimented on surfaces of both the silicon semiconductor substrate and the gate terminal was changed to a metallic silicide film such as $CoSi_2$ or NiSi by heating the silicon semiconductor substrate.

After that, the metallic film sedimented on the sidewall dielectric film and the element isolation dielectric film was removed because such a film did not change to the silicide.

Next, interlayer dielectric films made from silicon oxide films such as BPSG (boron-doped phospho-silicate glass (film)) were sedimented on the silicon semiconductor substrate in accordance with the CVD method. Moreover, a contact hole was formed by etching the interlayer dielectric films in accordance with such as RIE method in order to expose the source/drain area and the metallic silicide film on the gate terminal.

Next, a metallic film of copper, aluminum and/or the like was formed on the interlayer dielectric film, and a patterning operation was conducted on the metallic film in order to form multiple wirings electrically connected via the contact hole to the metallic silicide film on both the source/drain area and the gate terminal. After that, a passivation film, or the like was formed on the semiconductor substrate, and the transistor was completed. The crystal size of the microcrystalline layer forming the gate dielectric film of the transistor was 3 nm, and a nitrogen ratio of the gate dielectric film was 20 at. %.

On the other hand, 5 types of transistors were produced which had gate dielectric films of 0, 1, 5, 7 and 10 nm crystal size by appropriately changing annealing conditions upon micro-crystallizing the non-crystalline hafnium-containing silicon oxide layer.

Figure 12:
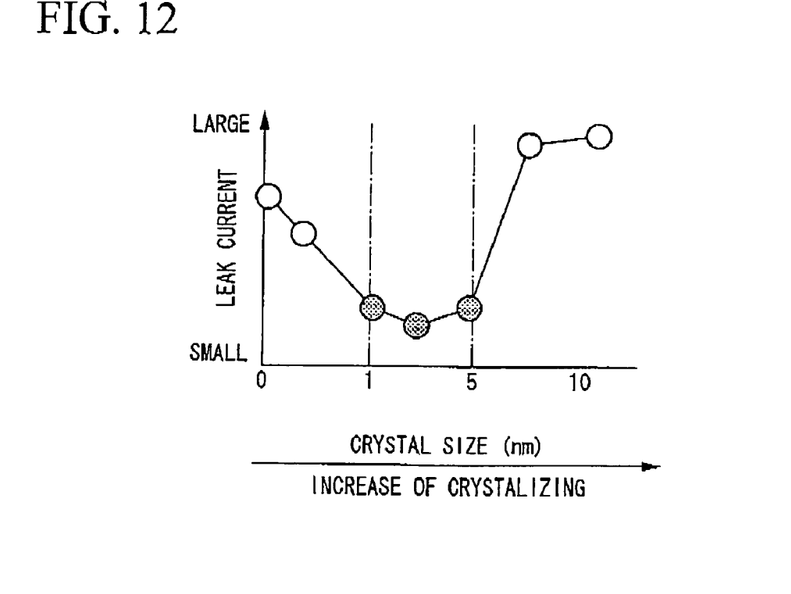
FIG. 12 is a graph showing the relationship between the leak current of a semiconductor apparatus and the crystal size of the dielectric film layered product in Experimental Example 1.

With regard to the produced transistors, relationship between leak current and the crystal size of the dielectric film layered products was researched. FIG. 12 shows the results.

As shown in FIG. 12, it is clear that leak current is reduced if the crystal size is in a range of 1-5 nm.

Example 2

In accordance with the same manner as the above-described Example 1 except for conditions of ammonia nitridation upon nitriding the non-crystalline hafnium-containing silicon oxide layer, three types of transistors were produced in conditions of 1, 15 and 40% nitrogen ratio of the gate dielectric film. With regard to the produced transistors, relationship between boron leakage and nitrogen ratio was researched. The results are shown in FIG. 13.

Figure 13:
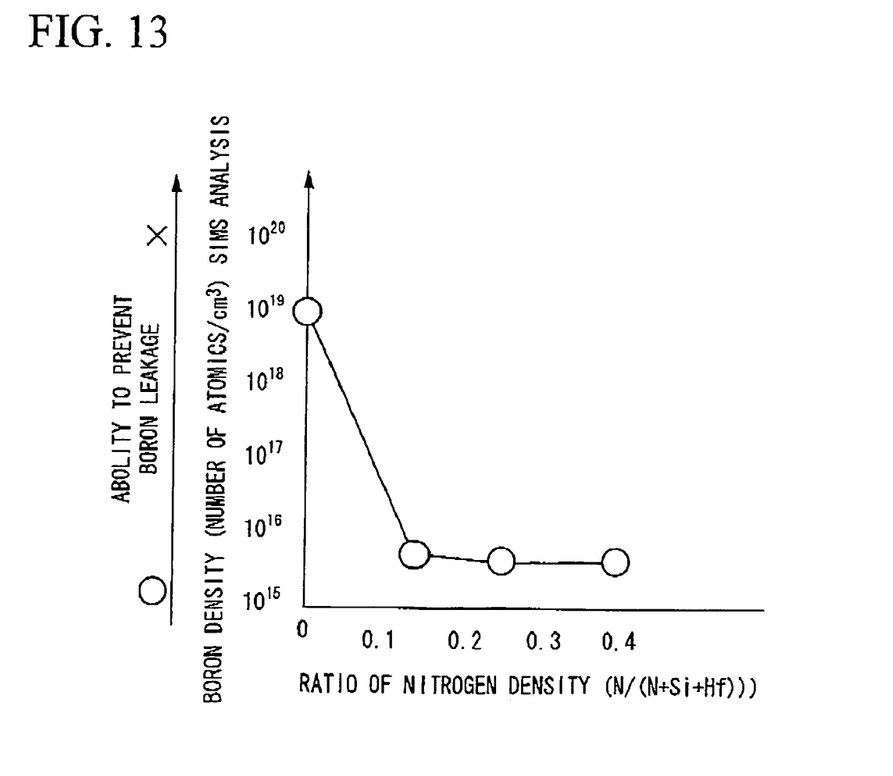
FIG. 13 is a graph showing the relationship between the boron leakage of a semiconductor apparatus and the nitrogen ratio of the dielectric film layered product in Experimental Example 2.

As shown in FIG. 13, it is clear that boron leakage is reduced if the nitrogen ratio is in the range of 15-40%.

Example 3

In accordance with the same manner as the above-described Example 1 except for forming the gate dielectric film on which the non-crystalline layer was not formed, that is, the gate dielectric film was constituted only form the microcrystalline layer, a transistor was produced which had the gate dielectric film having the microcrystalline layer with a crystal size of 0-10 nm.

Figure 14:
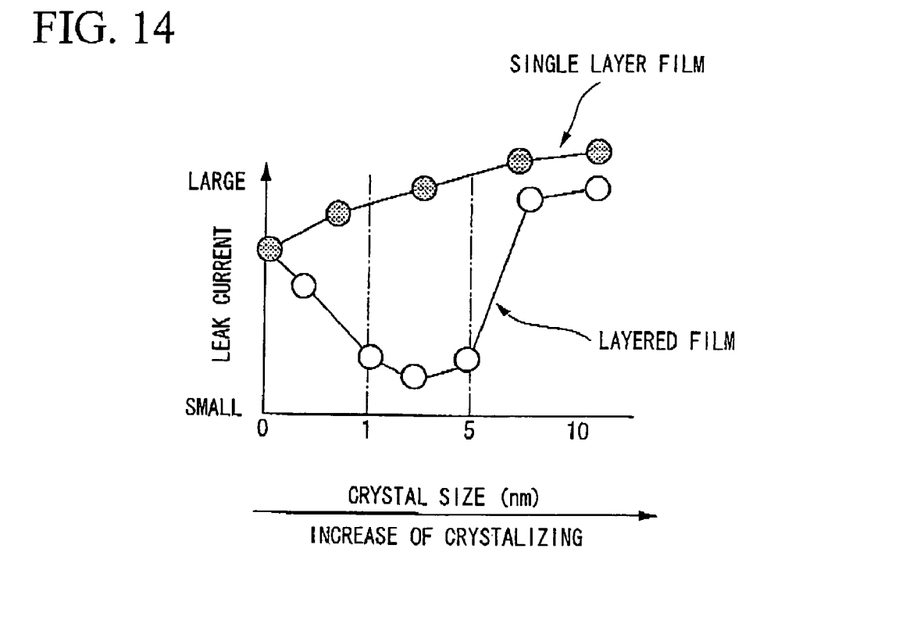
FIG. 14 is a graph showing the relationship between the leak current of a semiconductor apparatus and the crystal size of the dielectric film layered product in Experimental Example 3.

With regard to the produced transistor, the relationship between the leak current and the crystal size of the dielectric film layered product was researched. FIG. 14 show the results.

As shown in FIG. 14, it is clear that the leak current is reduced if the crystal size of the gate dielectric film made from the microcrystalline layer and the non-crystalline layer is in the range of 1-5 nm. On the other hand, the leak current of the gate dielectric film made from only the non-crystalline layer was not reduced even though crystal size was changed.

Example 4

In accordance with the above-described Example 2 except that the gate dielectric film was not formed on which the non-crystalline layer, that is, the gate dielectric film was constituted only from the microcrystalline layer, a transistor was produced which had the gate dielectric film having nitrogen a ratio of 0-40 at. %.

With regard to the produced transistors, the relationship between boron leakage and nitrogen ratio was researched. The results are shown in FIG. 15.

Figure 15:
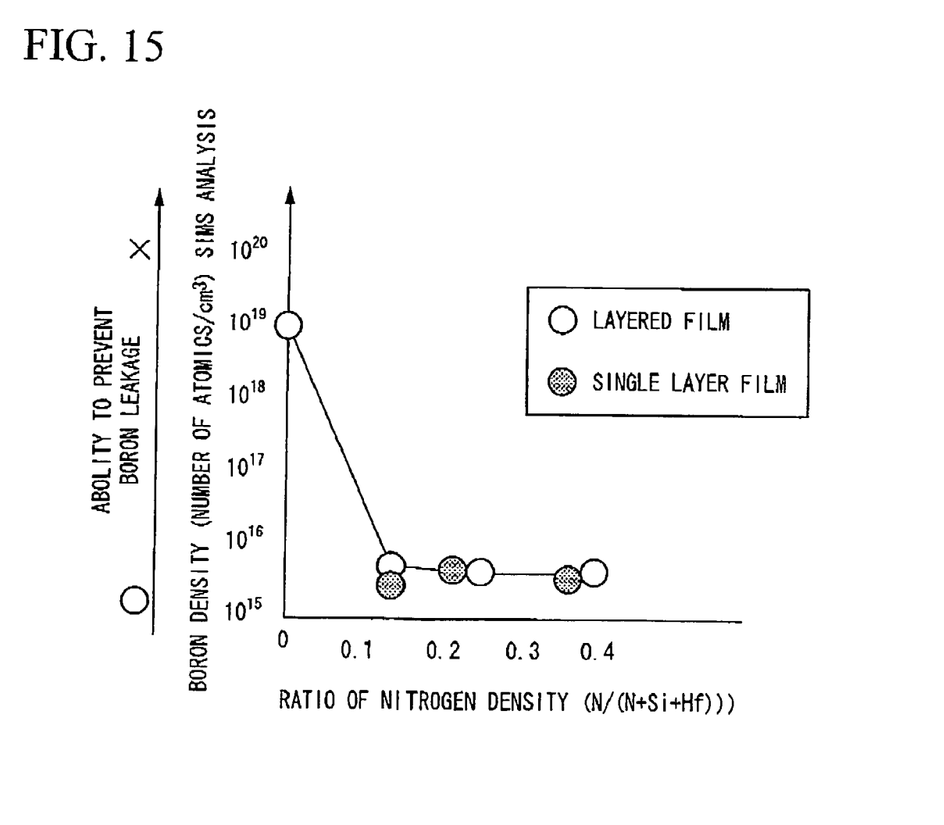
FIG. 15 is a graph showing the relationship between the boron leakage of a semiconductor apparatus and the nitrogen ratio of the dielectric film layered product in Experimental Example 4.

As shown in FIG. 15, it is clear that, with regard to the gate dielectric film made from the microcrystalline layer and the non-crystalline layer, boron leakage is reduced if the nitrogen ratio is in the range of 15-40%. Such a reduced boron leakage is substantially the same amount as boron leakage of the gate dielectric film made only from the microcrystalline layer. Therefore, even if the gate dielectric film includes the microcrystalline layer which is not appropriate for preventing boron leakage, it is clear that the above-described gate dielectric film can improve the ability to prevent boron leakage by adjusting nitrogen ratio of the overall gate dielectric film including the microcrystalline layer.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A dielectric film layered product comprising:
   a semiconductor substrate;
   a first hafnium-containing silicon oxide nitride layer having a microcrystalline structure; and
   a second hafnium-containing silicon oxide nitride layer having a non-crystalline structure;
   wherein the first and second hafnium-containing silicon oxide nitride layers are layered on the semiconductor substrate, and together constitute a layered film which has a nitrogen ratio of 15-40 atomic percent.

2. A dielectric film layered product according to claim 1, wherein the first hafnium-containing silicon oxide nitride layer is set on the second hafnium-containing silicon oxide nitride layer.

3. A dielectric film layered product according to claim 2, wherein the first hafnium-containing silicon oxide nitride layer comprises a crystal size of 1-5 nm.

4. A dielectric film layered product according to claim 1, wherein the second hafnium-containing silicon oxide nitride layer is set on the first hafnium-containing silicon oxide nitride layer.

5. A dielectric film layered product according to claim 4, wherein the first hafnium-containing silicon oxide nitride layer comprises a crystal size of 1-5 nm.

6. A dielectric film layered product according to claim 1, wherein the first hafnium-containing silicon oxide nitride layer comprises a crystal size of 1-5 nm.

7. A dielectric film layered product according to claim 6, wherein the crystal size of the first hafnium-containing silicon oxide nitride layer is obtained based on a diffraction peak of (111) of a diffraction pattern obtained by applying an in-plane-X-ray diffraction measuring method.

8. A semiconductor apparatus comprising a MOS transistor, wherein the MOS transistor comprises a gate dielectric film which is the dielectric film layered product according to claim 1.

* * * * *

UNITED STATES PATENT AND TRADEMARK OFFICE
CERTIFICATE OF CORRECTION

PATENT NO.        : 7,786,539 B2
APPLICATION NO.   : 11/972729
DATED             : August 31, 2010
INVENTOR(S)       : Takakazu Kiyomura et al.

Page 1 of 1

It is certified that error appears in the above-identified patent and that said Letters Patent is hereby corrected as shown below:

On the cover, item (54), change the Title of the Invention from
          "DIELETRIC FILM LAYERED PRODUCT" to
          --DIELECTRIC FILM LAYERED PRODUCT--;

Column 1, line 1, change "DIELETRIC FILM LAYERED PRODUCT" to
          --DIELECTRIC FILM LAYERED PRODUCT--.

Signed and Sealed this

Eighth Day of March, 2011

David J. Kappos
*Director of the United States Patent and Trademark Office*